(12) United States Patent
Moreland et al.

(10) Patent No.: US 6,307,491 B1
(45) Date of Patent: Oct. 23, 2001

(54) TRIM SYSTEMS AND METHODS HAVING TEMPORARY AND PERMANENT OPERATIONAL MODES

(75) Inventors: Carl W. Moreland, Oak Ridge; Russel G. Stop, Winston-Salem, both of NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/512,730

(22) Filed: Feb. 24, 2000

(51) Int. Cl.[7] .................................................. H03M 1/10
(52) U.S. Cl. ........................ 341/121; 341/144; 341/155
(58) Field of Search .................................. 341/120, 121, 341/144, 155, 138, 133

(56) References Cited

U.S. PATENT DOCUMENTS

| | | | |
|---|---|---|---|
| 5,596,322 | * 1/1997 | Marsh et al. | 341/120 |
| 5,635,934 | 6/1997 | Brown | 341/118 |
| 5,642,116 | * 6/1997 | Gersbach et al. | 341/120 |
| 5,760,720 | * 6/1998 | Nolan et al. | 341/120 |
| 5,933,370 | 8/1999 | Holzman et al. | 365/189.05 |
| 5,973,631 | * 10/1999 | McMullen | 341/144 |

OTHER PUBLICATIONS

Sheingold, David H. (edited by), *Analog–Digital Conversion Handbook*, Prentice Hall, Englewood Cliffs, New Jersey, 1986, pp. 533–541.

\* cited by examiner

*Primary Examiner*—Peguy JeanPierre
(74) *Attorney, Agent, or Firm*—Koppel & Jacobs

(57) ABSTRACT

Latch systems and methods are configured to temporarily latch trim signals in experimental combinations of set and reset states and, subsequently, to permanently latch the trim signals in a preferred combination (i.e., a combination that optimizes the performance parameters of an electronic circuit). Latch systems of the invention include a latch, a reset driver, a temporary-set driver and a permanent-set driver and are particularly suited for determining a preferred combination of set and reset states prior to permanently latching this preferred combination.

12 Claims, 6 Drawing Sheets

TRIM SYSTEMS AND METHODS HAVING TEMPORARY AND PERMANENT OPERATIONAL MODES

BACKGROUND OF THE INVENTION

1. Field of the Invention

The present invention relates generally to trimming (i.e., adjustment) of electronic circuits to improve their performance parameters.

2. Description of the Related Art

Elements of electronic circuits are often trimmed during manufacture and test to enhance the circuit's performance parameters. When the performance parameters must meet rigorous specifications, analysis algorithms are often used to determine circuit errors and the trimming required to reduce these errors.

It would be advantageous to be able to temporarily effect an experimental trim and have the ability to "untrim" the circuit if necessary. If, in contrast, "hard-trimming" is the only available option, then an improperly trimmed circuit is ruined and the trimming operator must proceed to another part which may have significantly different errors that require adjustment of the analysis algorithm. If an option were available for addressable and reversible trimming, the operator could adjust the analysis algorithm and repeatedly "re-trim" the same part.

SUMMARY OF THE INVENTION

The present invention is directed to trim systems and methods that have temporary and permanent operational modes for trimming electronic circuits with set and reset trim signals. The temporary mode permits a circuit's performance parameters to be evaluated when various combinations of set and reset trim signals are applied. The permanent mode is then used to permanently apply a preferred combination of set and reset trim signals to the circuit.

These objectives are realized with latch systems that include:

a) a latch that generates set and reset trim signals in respective response to set and reset latch signals;

b) a reset driver that applies the reset latch signal to the latch;

c) temporary-set driver which removes the reset latch signal from the latch in response to a mode-select signal and which applies the set latch signal to the latch in response to a state-select signal; and d) a permanent-set driver which includes a trimmable link and which responds to the trimming of the link by removing the reset latch signal from the latch and applying the set latch signal to the latch.

These latch systems facilitate the use of latch methods that include the steps of:

a) temporarily latching each of a plurality of trim signals in a an experimental combination of set and reset trim states;

b) assessing the response of the circuit's performance parameters to the experimental combination;

c) repeating steps a) and b) to find a preferred combination of set and reset trim states; and d) permanently latching the trim signals in the preferred combination.

The novel features of the invention are set forth with particularity in the appended claims. The invention will be best understood from the following description when read in conjunction with the accompanying drawings.

DETAILED DESCRIPTION OF THE EMBODIMENTS

Figure 1:
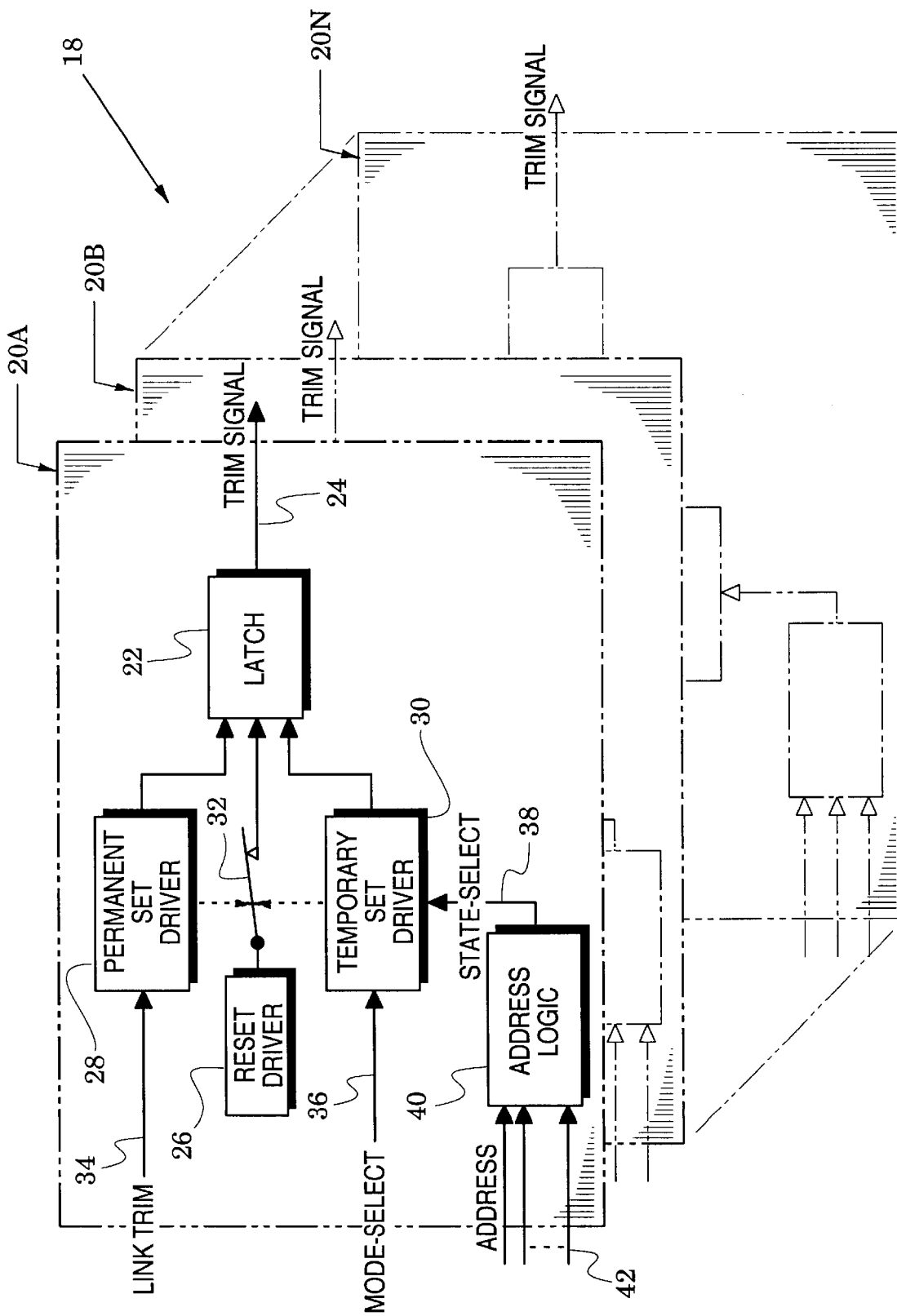
FIG. 1 is a block diagram of an array of latch systems that each temporarily and permanently generate set and reset trim signals.

The block diagram of FIG. 1 illustrates an array 18 of latch system embodiments 20A–20N wherein the array generates trim signals that can be applied to an electronic circuit whose performance parameters are responsive to the trim signals. The trim signals each have set and reset states and the array 18 is particularly suited for determining a preferred combination of the set and reset states, i.e., a combination that optimizes the performance parameters of the electronic circuit.

To facilitate determination of the preferred combination, the latch systems 20 are configured to temporarily latch the trim signals in experimental combinations of set and reset states and, subsequently, to permanently latch the trim signals in the preferred combination.

The latch systems 20B–20N of FIG. 1 are identical to the latch system 20A which includes a latch 22 that provides a trim signal 24 in response to a reset driver 26, a permanent set driver 28 and a temporary set driver 30. The reset driver 26 is coupled to the latch through a switch 32 which is responsive to the permanent set driver 28 and temporary set driver 30.

The permanent set driver 28 responds to a link trim 34 and the temporary set driver 30 responds to a mode-select signal 36 and a state-select signal 38 that is generated by a logic circuit 40 in response to an n-bit address 42. The link trim 34 represents a physical trim (e.g., removal or partial removal) of a link component (e.g., a resistor or an interconnection) that connects portions of the permanent set driver 28. After the link trim is effected, the permanent set driver 28 permanently applies a set latch signal to the latch 22.

Figure 2:
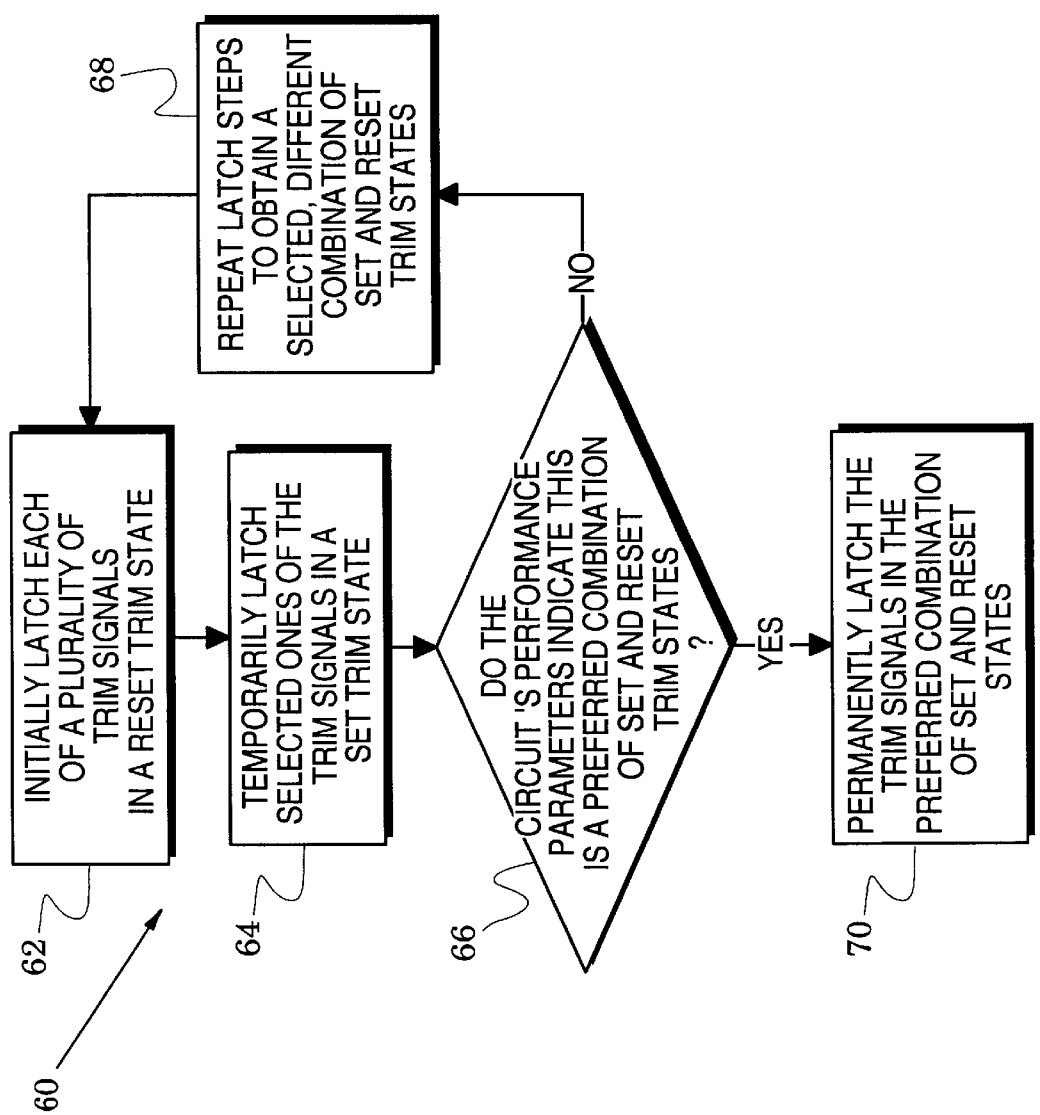
FIG. 2 is a flow chart that illustrates latching processes in the latch-system array of FIG. 1.

An exemplary operation of the latch-system array 18 of FIG. 1 is illustrated in the flow chart 60 of FIG. 2. In a first process step 62 of this chart, a plurality of trim signals are initially latched in reset trim states. In the array 18 of FIG. 1, this step is realized with the reset driver 26 of each latch system 20 as it applies a reset latch signal (e.g., a reset current) to its respective latch 22 to latch it's respective trim signal 24 in a reset trim state.

In a second process step 64 of the flow chart 60 of FIG. 2, selected ones of the trim signals are subsequently latched in their set trim states. This step is effected in the latch-system array 18 of FIG. 1 with mode-select signals and addresses. In response to the mode-select signal, the temporary set driver 30 of each latch system 20 opens its respective switch 32 to remove the reset latch signal from its respective latch 22. Because the latches are bistable devices, their trim signals remain in their reset trim states.

The address signals are then configured to cause the address logic 40 in selected ones of the latch systems 20 to apply a state-select signal to their temporary set drivers 30. In response, those selected temporary set drivers apply set latch signals to their respective latches 22 which places the trim signals of these bistable devices in their set trim state.

After the process steps 62 and 64 of FIG. 2 have been realized, the trim signals 24 of the array 18 of FIG. 1 have a first experimental combination of set and reset trim states which can be applied to any trimmable circuit whose performance parameters are responsive to the trim signals. The decision step 66 of FIG. 2 asks if the circuit's performance parameters indicate this to be a preferred combination of set and reset trim states.

If this experimental combination fails to optimize the circuit's performance, decision step 66 leads to process step 68 which repeats the latch steps of process steps 62 and 64 to realize a selected and different combination of set and reset trim states, i.e., a second experimental combination. The latch systems 20 of FIG. 1 facilitate the realization of process step 68 because they temporarily latch the trim signals and, accordingly, the experimental combinations can be repeated as often as is desired.

The loop formed by process step 68 is repeated until decision step 66 finds that the current experimental combination of set and reset trim states is the preferred combination. At this point, the flow chart 60 moves to process step 70 which permanently latches the trim signals in the preferred combination of set and reset trim states.

Process step 70 is realized in the array 18 of FIG. 1 with the link trims 34. In those latch systems 20 whose trim signals are to be latched in a set trim state, the link trim 34 is effected which causes the respective permanent set driver 28 to open the switch 32 (and thereby remove the reset latch signal) and also apply a set latch signal to the respective latch 22. Because it no longer receives a latch reset signal from its reset driver 26 and does receive a latch set signal form its permanent set driver 28, the respective latch permanently changes its trim signal to its set trim state.

In those latch systems 20 whose trim signals are to be latched in a reset trim state (in accordance with the preferred combination of trim states), the switch 32 remains closed and the respective reset driver 26 continues to apply a reset latch signal to its respective latch 22. Accordingly, the latch signals of these respective latches remain in their reset trim states.

Figure 3:
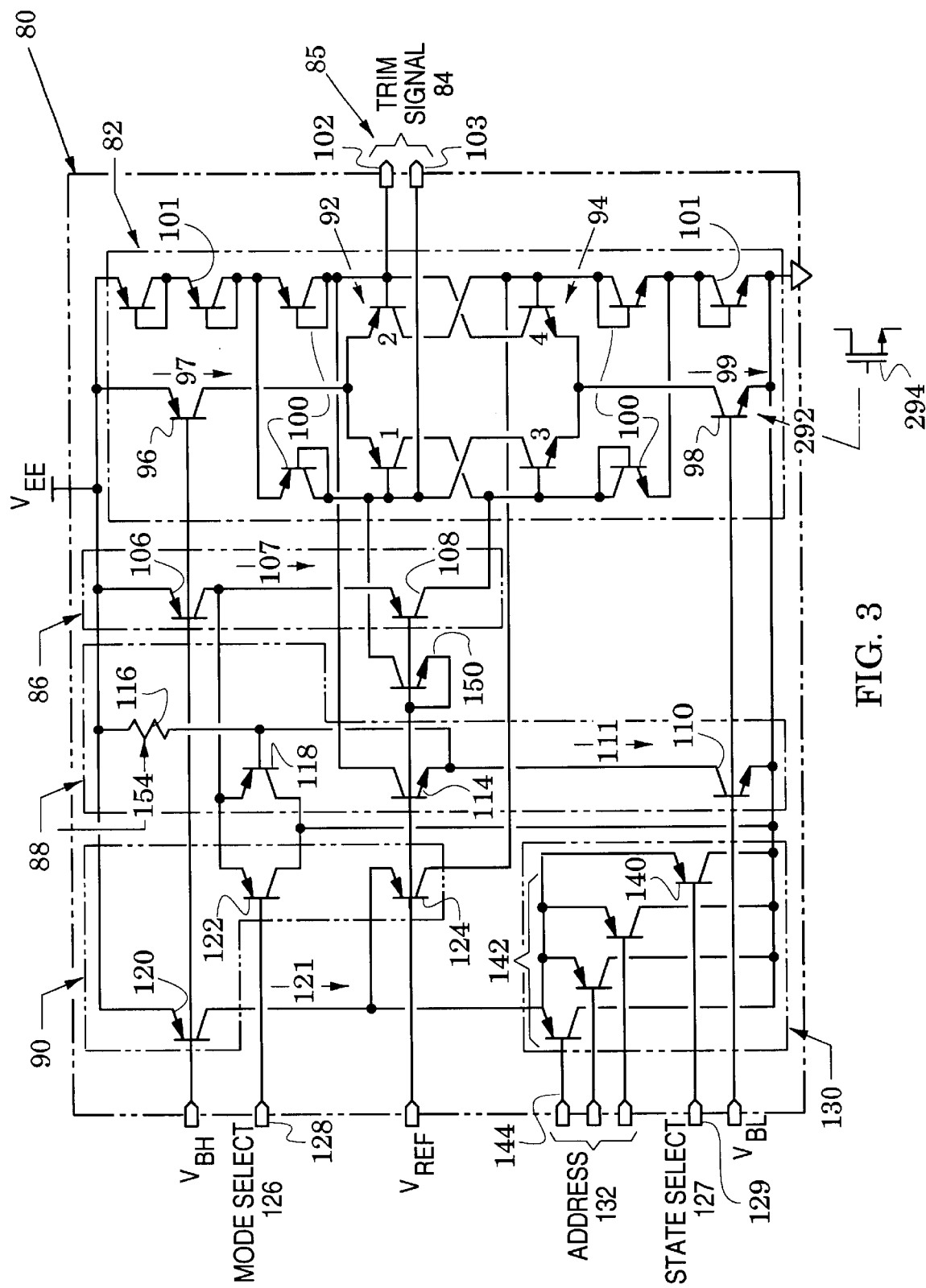
FIGS. 3 and 4 are schematics of embodiments of an exemplary one of the latch systems of FIG. 1.

A further understanding of the structure and method of FIGS. 1 and 2 is facilitated by the following description of FIG. 3 which illustrates an embodiment 80 of the latch system 20A of FIG. 1. Similar to the latch system 20A, the latch system 80 includes a latch 82 that provides a differential trim signal 84 at an output port 85 in response to a reset driver 86, a permanent set driver 88 and a temporary set driver 90.

The latch 82 is formed with a first differential pair 92 of first and second transistors (indicated by reference numbers 1 and 2) and a second differential pair 94 of third and fourth transistors (indicated by reference numbers 3 and 4) that is arranged with the first differential pair in a regenerative-feedback relationship. In particular, the bases and collectors of the first and third transistors are cross-coupled and the bases and collectors of the second and fourth transistors are also cross-coupled.

In the latch 82, a transistor 96 is biased by a high bias $V_{BH}$ to act as a current source that provides a current 97 to the emitters of the first differential pair 92. Similarly, transistor 98 is biased by a low bias $V_{BL}$ to act as a current source that provides a current 99 to the emitters of the of the second differential pair 94. Diode-coupled transistors 100 provide active loads for the collectors of the first and second differential pairs 92 and 94. Finally, diode-coupled offset transistors 101 couple the diode-coupled transistors 100 to ground and to $V_{EE}$ and are thus arranged so that their voltage drops prevent saturation of the current source transistors 96 and 98.

Because of its regenerative feedback, the latch 82 is bistable. Accordingly, an external latch current coupled to either base of the first and third cross-coupled transistors will cause them to conduct the currents of the current-source transistors 96 and 98. In this condition, the second and fourth transistors are cutoff and the lower side 103 of the output port 85 will be more negative than the upper side 102. Alternatively, a current can be pulled through the lower side 103 from an external circuit. Although the terminology is relative, this condition will henceforth be termed the reset state of the latch 80 in which the trim signal 84 at the output port 85 is a reset trim signal.

The other bistable state of the latch 82 is realized when an external latch current is coupled to either base of the second and fourth cross-coupled transistors because this causes them to conduct the currents of the current-source transistors 96 and 98. In this latter condition, the first and third transistors are cutoff and the upper side 102 of the output port 85 will be more negative than the lower side 103. Alternatively, a current can be pulled through the upper side 102 from an external circuit.

This condition will henceforth be termed the set state of the latch 80 in which the trim signal 84 at the output port 85 is a set trim signal. It is apparent, therefore, that the trim signal 84 can be applied to an external circuit as a differential voltage and/or as a differential current both of which can be placed in set or reset states.

The reset driver 86 includes a current-source transistor 106 that is biased (by the high bias $V_{BH}$) as a current source that provides a reset current 107. A reset transistor 108 is biased by a reference bias $V_{REF}$ and, in response, steers the current 107 to the base of the third transistor of latch 82. As described above, this current acts as a reset latch signal which causes the bistable latch to deliver a reset trim signal at the output port 85.

The permanent set driver 88 includes a current-source transistor 110 that is biased (by the low bias $V_{LH}$) as a current source that provides a current 111. A set transistor 114 is biased by the reference bias $V_{REF}$ and is coupled between the current-source transistor 110 and the base of the second transistor of the latch 82. The emitter of the set transistor is coupled to $V_{EE}$ by a link component in the form of a link resistor 116. A third transistor 118 has its base coupled to the link resistor 116, its collector coupled to ground and its emitter coupled to the current-source transistor 106 of the reset driver 86.

The current 111 flows through the link resistor 116 to develop a potential at the emitter of the set transistor 114 that is sufficiently high (relative to the reference voltage $V_{REF}$) to keep this transistor cutoff. The same potential is also applied to the base of the third transistor 118 and is sufficiently high (relative to the reference voltage $V_{REF}$) that this transistor is cutoff and the reset current 107 is directed through the reset transistor 108 of the reset driver 86.

The temporary set driver 90 includes a current-source transistor 120 that is biased (by the high bias $V_{BH}$) as a current source that provides a current 121. A mode select transistor 122 is coupled to form a differential pair with the third transistor 118 of the permanent set driver 88. A temporary-set transistor 124 is biased by the reference voltage $V_{REF}$ and is coupled between the current source transistor 120 and the base of the fourth transistor of the latch 82.

The permanent set driver 88 is responsive to a link trim that trims the link resistor 116 and the temporary set driver 90 is responsive to a mode-select signal 126 at a mode-select port 128 and to a state-select signal 127 at a state-select port 129. If the mode select signal 126 is low, the latch system 80 is placed in a temporary mode of operation because the reset current 107 is diverted through the mode select transistor 122.

An address logic 100 has a plurality of address transistors 142 that are each coupled to carry the current 121 of the current source transistor 120 of the temporary set driver 90 and each has its base coupled to an address signal 132 that is applied to address lines 144. A state select transistor 140 is also coupled to carry the current 121 but it responds to the state-select signal 127.

If the state select signal 127 is low, the state select transistor 140 conducts the current 121 regardless of the condition of the address 132. However, if the state select signal 127 is high and all address lines 144 are also high, the set current 121 is diverted through set transistor 124 to the base of the fourth transistor of the latch 82. If one of the address lines 144 is low at this time, the set current 121 flows through a respective one of the address transistors 142 and no current flows through the set transistor 124.

The mode select signal 126 thus disables the reset current 107 (by pulling it away from the reset transistor 108) and the state select signal 127 enables the address 132 to determine a temporary state of the latch 82. The state select signal 127 is preferably applied when the address 132 has settled in a desired condition and is subsequently removed so that the latch system 80 is no longer responsive to the levels of the address lines 144.

A diode-coupled transistor 150 is coupled between the bias $V_{REF}$ and the base of transistor 1 of the latch 82. This diode-coupled transistor provides capacitance to one side of the differential pair 92 to thereby enhance the stability of the latch 82. Except for its effect on stability, it does not participate in the following operation.

The operation of the latch system 80 is also in accordance with the flow chart 60 of FIG. 2. For example, process step 62 of the flow chart initially latches each trim signal in a reset trim state. In the latch system 80, the reset driver 86 generates the reset current 107 and injects it (via the reset transistor 108) into the base of the first transistor of the latch 82 to thereby latch the latch 82 in its reset state.

The second process step 64 of the flow chart temporarily latches selected trim signals in a set trim state. Assuming the latch system 80 of FIG. 3 is one of the selected systems (of the systems array 18 of FIG. 1), this step is performed by first applying the mode select signal 126 which places the system in a temporary mode of operation. In particular, this signal disables the reset driver 86 by diverting the reset current 107 through mode select transistor 122 to ground. The bistable latch 82 remains in its reset state but it is now able to respond to a set signal.

After the address 132 has reached a desired condition on the address lines 144, the state select signal 127 is momentarily applied to the state select transistor 140 to enable the address signal 132. If all address lines 144 are high, the set current 121 is diverted through set transistor 124 to the base of the fourth transistor of the latch 82 to thereby latch the latch 82 in its set state. If one of the address lines is low, the set current 121 is not applied to the latch 82 but, instead, it continues to flow to ground through the address logic 100.

From this operation, it is apparent that the mode select signal 126 places the latch system in a temporary mode in which it can be temporarily placed in a selected one of its set or reset state. Removal of the mode select signal 126 returns the latch system to its permanent mode in which the latch's set and reset states are obtained by respectively trimming and not trimming the link resistor 116.

The decision step 66 and the process step 68 of the flow chart 60 of FIG. 2 must then be conducted to place all of the latch systems of the array 18 of FIG. 1 into the preferred combination of set and reset states. After this, the process step 70 requires that all trim signals be latched in the preferred combination.

If the process step 70 requires that the latch system 80 of FIG. 3 be permanently latched in the reset state, no action is required except to remove the mode select signal 126. The latch is left with reset current 107 permanently flowing from the permanent set driver 86 to the latch 82. If the process step 70 requires that the latch system 80 be permanently latched in the set state, the link resistor 116 is trimmed as indicated by the link trim arrow 154.

This trimming is sufficient to permit the transistor 118 to turn on which diverts (to ground) the reset current 107 from the reset driver 86 and is sufficient to permit the set transistor 114 to turn on which pulls the set current 111 from the base of the second transistor of the latch 82. Although this trimming process can be effected with partial removal of the link resistor, it is preferable and simpler to remove this resistor in any conventional manner (e.g., with a laser or with a current pulse). The latch is now permanently placed in its set state.

Figure 4:
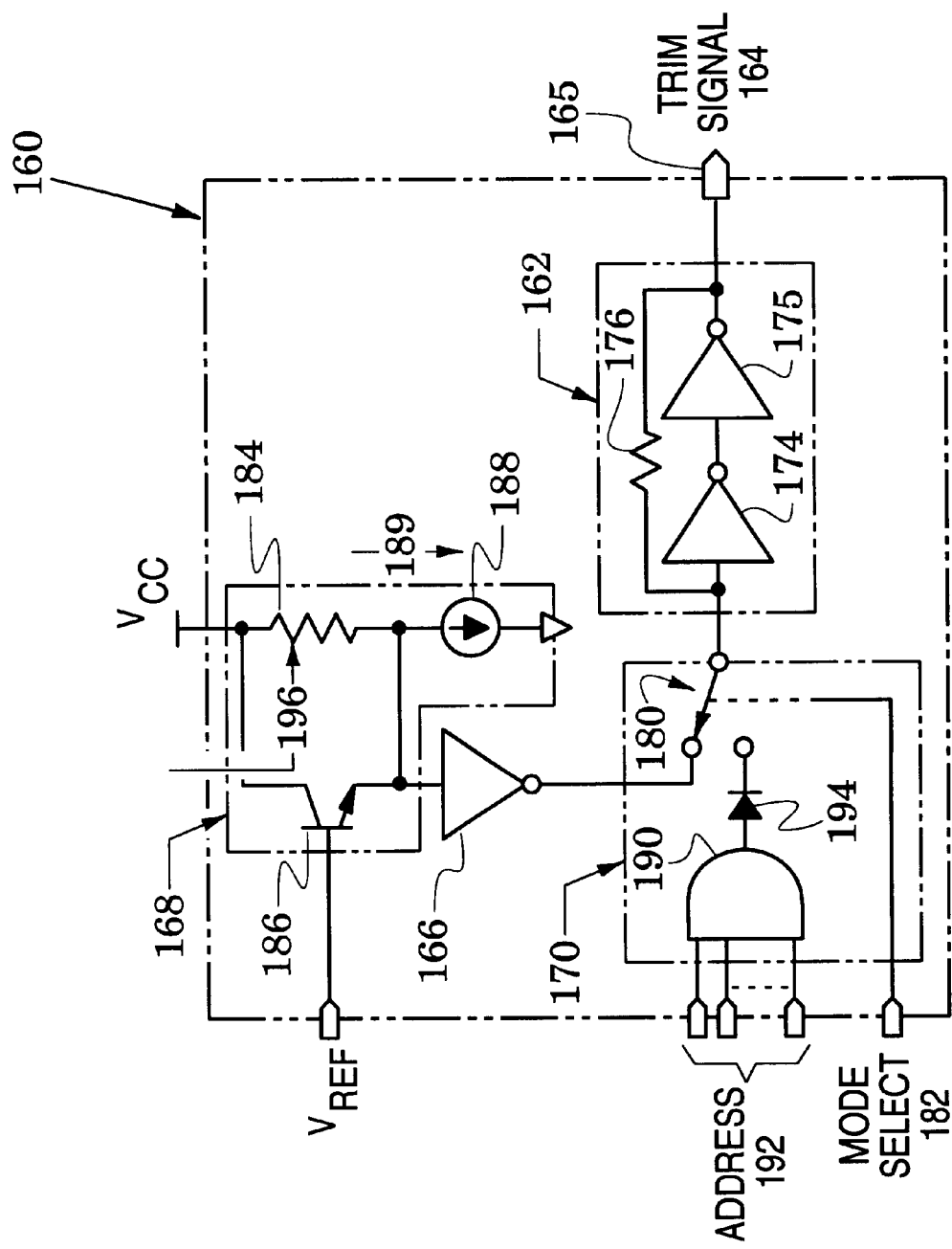

FIG. 4 illustrates another embodiment 160 of the latch system 20A of FIG. 1. Similar to the latch system 20A, the latch system 160 includes a latch 162 that provides a trim signal 164 at an output port 165 in response to a reset driver 166, a permanent set driver 168 and a temporary set driver 170.

The latch 162 is formed with a serial arrangement of inverters 174 and 175 that are paralleled by a regenerative feedback path in the form of a resistor 176. The feedback path provides a "weak" feedback so that the latch 162 is bistable, i.e., it retains a given output state in the absence of a first input signal but can be latched in a different state by an overriding second input signal of sufficient strength. Preferably, the latch also contains conventional circuitry that places it in its reset state upon "power up".

The reset driver 166 is an inverter that provides a low signal which transits a mode select switch 180 to drive the latch 162 into a reset trim signal state. The reset driver 166 acts as a voltage source to provide a reset voltage signal to the latch 162.

The permanent set driver 168 includes a link resistor 184 that is coupled in parallel with a set transistor 186 and coupled in series with a current source 188 to thereby carry a current 189. The set transistor's base is biased with a reference voltage $V_{REF}$. The values of the link resistor 184 and the current 189 are chosen so that the voltage at the emitter of transistor 186 is sufficient (compared to $V_{REF}$) to keep transistor 186 cut off.

The temporary set driver 170 includes the mode select switch 180 which responds to a mode select signal 182. This driver also has an address logic in the form of an AND gate 190 that receives address lines 192. The gate 190 is coupled to the mode select switch 180 by a diode 194. In the mode select switch position shown in FIG. 4, the latch system is in its permanent set mode. When the switch 180 is thrown opposite to the position shown, the latch system is in its temporary set mode.

The operation of the latch system 160 is in accordance with the flow chart 60 of FIG. 2. Process step 62 of the flow chart initially latches each trim signal in a reset trim state and, in the latch system 160, the reset driver 166 injects a low signal (via the mode select switch 180) into the latch 162 to thereby cause it to provide a low reset trim signal at the output port 165.

The second process step 64 of the flow chart temporarily latches selected trim signals in a set trim state. Assuming the latch system 160 of FIG. 4 is one of the selected systems (of the array 18 of FIG. 1), this step is performed by first applying the mode select signal 182 which switches the mode select switch 180 to remove the reset latch signal of the inverter 166 and, in its place, couple the diode 194 to the latch 162.

When a set decision is made by causing all of the address lines 192 to go high, the gate 190 injects a high latch signal (via the mode select switch 180) into the latch 162 to thereby cause it to provide a high set trim signal at the output port 165. When the output of the gate 190 subsequently goes low (e.g., due to subsequent address signals intended for other latch systems), the latch 162 remains latched in its set state because of the isolation provided by the diode 194. If a set decision is not made, the latch 162 remains in its reset state in which it provides a low set trim signal at the output port 165.

From this operation, it is apparent that the mode select signal 182 places the latch system in a temporary mode in which it can be temporarily placed in a selected one of its set or reset state. Removal of the mode select signal 182 places the latch system in its permanent mode in which the latch's set and reset states are obtained by respectively trimming and not trimming the link resistor 184.

The decision step 66 and the process step 68 of the flow chart 60 of FIG. 2 must now be conducted to determine the preferred combination of set and reset states for the array 18 of FIG. 1. After this, the process step 70 requires that all trim signals be permanently latched in the preferred combination.

If the process step 70 requires that the latch system 160 be permanently latched in the reset state, no action is required except to remove the mode select signal 182 so that the switch 180 returns to the position shown in FIG. 4. If the process step 70 requires that the latch system 160 be permanently latched in the set state, the link resistor 184 is trimmed as indicated by the link trim arrow 196. As a result, the input to the inverter 166 drops low (a diode drop below $V_{REF}$) which causes the output of the inverter to go high. This is a set latch signal that places the latch 162 in its latch state so that it provides a high set trim signal at the output port 165.

Figure 5:
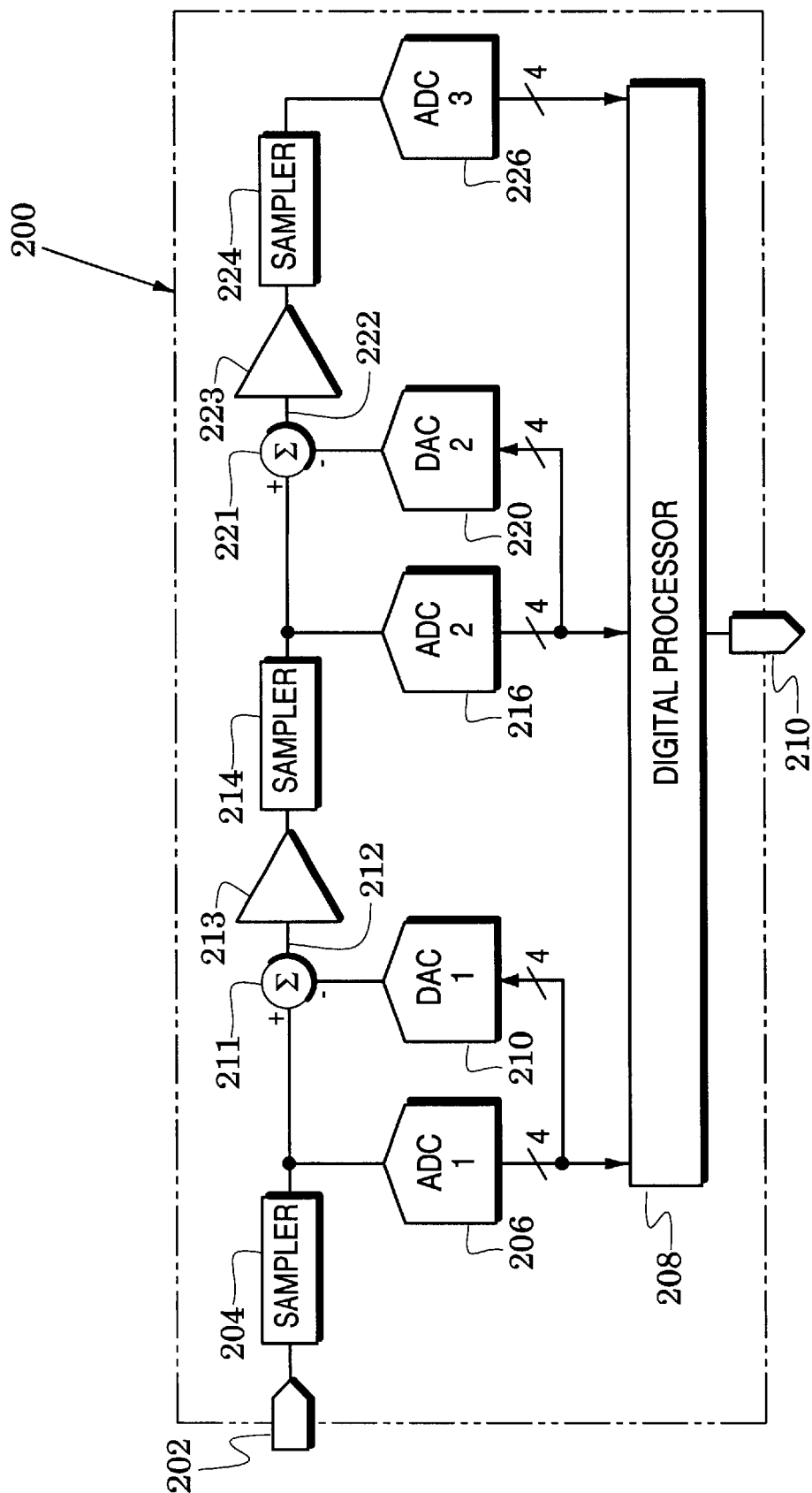
FIG. 5 is a block diagram of a subranging analog-to-digital converter (ADC) that requires a precision digital-to-analog converter (DAC)

An exemplary application of the array 18 of latch systems of FIG. 1 is illustrated with reference to the subranging ADC 200 of FIG. 5. This ADC receives analog signals at an input port 202 where they are sampled by an initial sampler 204. The sampled input is converted in an initial ADC 206 to an initial set of digital bits which are delivered to a digital processor 208.

An initial DAC 210 then converts the initial set of digital bits to a converted analog signal which is subtracted from the sampled input in a differencer 211 to form an initial residue signal 212. Because this action results in an amplitude reduction, the initial residue signal is preferably "gained up" in an amplifier 213 and then sampled in a subsequent sampler 214.

The initial conversion process is then repeated. That is, the sampled residue signal is converted in a subsequent ADC 216 to a subsequent set of digital bits which are delivered to the digital processor 208. A subsequent DAC 220 then converts the subsequent set of digital bits to a converted analog signal which is subtracted from the sampled residue signal in a differencer 221 to form a subsequent residue signal 222.

The subsequent residue signal passes through another amplifier 223 and is sampled in a final sampler 224. A final ADC 226 converts the sampled subsequent residue signal into a final set of digital bits which are combined in the digital processor 208 with the initial and subsequent sets of digital bits to form the final digital output signal at an output port 210.

In an exemplary 12-bit conversion embodiment, the initial ADC and DAC are 4-bit devices, the subsequent ADC and DAC are 4-bit devices and the final ADC is also a 4-bit device. In another conversion embodiment, the subsequent and final ADCs may be structured to realize an extra digital bit. This extra conversion range is used in conjunction with error correction logic in the digital processor 208 to correct the output signal for most of the errors inherent in the subranging structure.

Figure 6:
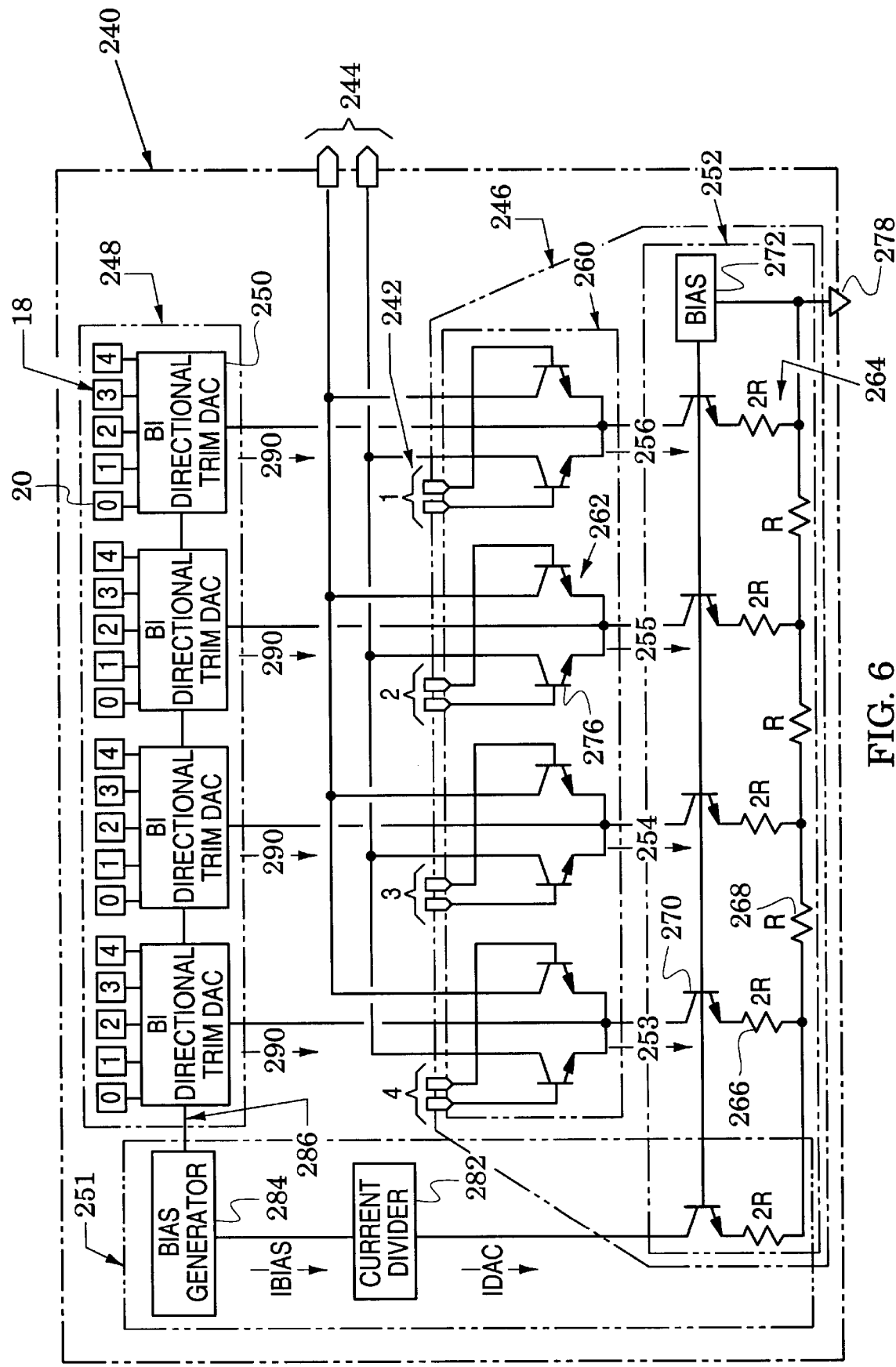
FIG. 6 is a schematic of the precision DAC of FIG. 5 which is realized with the latch-system array of FIG. 1.

In either of these exemplary embodiments, the final DAC must have 4-bit linearity for the subranging ADC to be linear to an LSB/2. In the subsequent and initial conversion stages, however, an LSB/2 error respectively requires 8-bit and 12-bit DAC linearity. The subsequent and initial DACs are therefore required to be 4-bit devices that can convert with 8-bit and 12-bit linearity respectively. Accordingly, the DACs 210 and 220 are preferably realized with a precision DAC system 240 that is shown in FIG. 6 and described below.

The precision DAC system 240 converts a digital signal at an input port 242 into an analog signal at a differential output port 244. The DAC system 240 includes a primary DAC 246, a set 248 of bidirectional trim DACs 250 and a current coupler 251 that controls current relationships between the primary DAC 246 and the bidirectional trim DACs 250.

The DAC system thus supplements a 4-bit primary DAC 246 with bidirectional trim DACs 250 that can be programmed to correct errors and achieve linearities in the DAC system 240 that are substantially greater than that of a conventional 4-bit linearity. The programming is effected with the array 18 of latch systems 20 of FIG. 1. The array 18 is combined with the trim DACs 250 and arranged with five of the latch systems 20 coupled to each of the trim DACs 250.

The primary DAC 246 has a binary-weighted current source 252 that generates binary-weighted currents 253, 254, 255 and 256. The primary DAC 246 also has a set 260 of current switches 262 that couple respective binary-weighted currents to the output port 244 in response to respective bits of the digital signal at the input port 242.

The binary-weighted current source 252 is formed with an R-2R resistive ladder 264 having first ends of 2R-value resistors 266 connected by R-value resistors 268. Bias transistors 270 have respective first current terminals (emitters) coupled to second ends of respective 2R-value resistors 266 and have their control terminals (bases) coupled to a voltage bias source 272.

Preferably, the current switches 262 are differential pairs of transistors 276 wherein each differential pair is coupled between the differential output port 244 and a second current terminal (collector) of a respective one of the bias transistors 270. The control terminals of each differential pair are differentially coupled to form a respective bit input of the digital input port 242.

In accordance with a characteristic of R-2R resistive ladder structures, the ladder impedance presented to the left-hand terminal of each R-value resistor 268 is substantially R. Accordingly, voltages are halved as currents flow through the R-value resistors to the ground reference 278. Because the emitters of the bias transistors 270 have a common potential, the currents 253, 254, 255 and 256 are binary-weighted (i.e., the current through one 2R-value resistor 266 is twice that through an adjacent 2R-value resistor 266 that is further from the ground reference 278).

In operation of the primary DAC 246, each current switch 262 differentially steers a respective one of the binary-weighted currents (253–256) to the differential output port 244 in response to a respective digital bit at the input port 242. Each of the numbers 1–4 of the input port 242 indicate respective differential bit inputs and also designate an identifying number of the bit applied. A bit applied at bit input 1 is the most significant bit (MSB) and a bit applied at bit input 4 is the LSB. If current 253 has a magnitude I, for example, the currents 254, 255 and 256 has respective magnitudes 2I, 4I and 8I.

Each of the bidirectional trim DACs 250 has a structure similar to that of the primary DAC 246 except they are configured with five binary-weighted current sources and corresponding current switches. When the MSB current of this set is activated, it is subtracted from the other currents. Accordingly, each trim DAC 250 can generate a bidirectional trim current 290 that has 4 bits of resolution.

Preferably, the bidirectional trim currents of the trim DACs 250 are slaved to the currents of the primary DAC 246. This current-slaving control is supplied by the current coupler 251 which includes a current divider 282 and a bias generator 284. The current divider receives an IDAC current from the LSB of the primary DAC 246 and divides it to realize an IBIAS current which is converted to a bias voltage 286 that is supplied to each of the trim DACs 250.

For each trim DAC 250, one of the latch systems 20 is associated with its MSB current and is designated with the number 0. The other four latch systems 20 are associated with the other binary-weighted currents and are designated with the numbers 1–4. The direction and magnitude of each trim current 290 can thus be programmed with the latch systems 20 that are associated with that current's trim DAC 250.

Each of the trim currents 290 is summed in a respective one of the current switches 262 with a respective one of the binary-weighted currents 253–256. Each of these binary-weighted currents can thus be trimmed with its respective one of the bidirectional trim currents 290. Accordingly, adjustment of the performance parameters (e.g., linearity) of the precision DAC system 240 can be programmed with the array 18 of latch systems 20.

The latches of the invention (e.g., latch 22 of FIG. 1) can be formed with any of various conventional structures that employ regenerative feedback to realize a bistable output. The latch thus provides set and reset trim signals in response to set and reset latch signal inputs. The designations set and reset are relative and simply designate the latch's two bistable states.

The link components of the invention (e.g., link resistor 116 of FIG. 3) can be formed with any of various conventional connecting structures (e.g., resistors and fusible metallic traces) that can be reduced or removed with conventional methods (e.g., laser, abrasive or current-pulse trim).

The invention has been described with the aid of bipolar transistor embodiments. However the teachings of the invention may be practiced with any transistor structure (e.g., CMOS) which has first and second current terminals controlled by signals at a control terminal. An exemplary CMOS substitution is indicated by substitution arrow 290 and CMOS transistor 294 in FIG. 3.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A latch system that provides temporary and permanent set and reset trim signals for trimming an electronic circuit, comprising:

a latch that generates said set and reset trim signals in respective response to set and reset latch signals;

a reset driver that applies said reset latch signal to said latch;

a temporary-set driver which removes said reset latch signal from said latch in response to a mode-select signal and which applies said set latch signal to said latch in response to a state-select signal, said latch thereby generates said temporary set trim signal when said mode-select signal and said state-select signal are present and generates said temporary reset trim signal when said mode-select signal is present and said state-select signal is absent; and a permanent-set driver which includes a trimmable link and which, in response to the trimming of said link, removes said reset latch signal from said latch and applies said set latch signal to said latch, said latch thereby generates said permanent set trim signal when said mode-select signal is absent and said trimmable link is trimmed and generates said permanent reset trim signal when said mode-select signal is absent and said trimmable link is not trimmed.

2. The latch system of claim 1, further including an address logic that provides said state-select signal to said temporary-set driver in response to an address signal.

3. The latch system of claim 1, wherein said latch includes:

a first differential pair of transistors; and a second differential pair of transistors arranged with said first differential pair in a regenerative-feedback relationship to thereby generate said set an d reset trim signals in bistable response to said set and reset latch signals.

4. The latch system of claim 1, wherein said latch includes:

first and second serially-connected inverters; and a feedback path that regeneratively couples the output of said second inverter to the input of said first inverter.

5. The latch system of claim 1, wherein said reset latch signal is a reset current and further including a reset current source that provides said reset current.

6. The latch system of claim 1, where in s aid reset latch signal is a reset voltage and further including a reset voltage source that provides said reset voltage.

7. The latch system of claim 1, wherein:
said reset latch signal and said set latch signal are respectively a reset current and a set current; and
said permanent-set driver includes:
  a set current source that generates said set current; and
  at least one transistor wherein said trimmable link is arranged so that its trimming causes said at least one transistor to divert said reset current from said latch and couple said set current to said latch.

8. The latch system of claim 1, wherein said reset driver provides said reset and set latch signals in response to first and second input signals from said permanent set driver; and
said permanent set driver provides said first input signal if said trimmable link is not trimmed and provides said second input signal if said trimmable link is trimmed.

9. The latch system of claim 1, wherein said reset latch signal and said set latch signal are respectively a reset current and a set current and said temporary-set driver includes:
  a set current source that generates said set current; and
  at least one transistor arranged to divert said reset current from said latch in response to said mode-select signal and couple said set current to said latch in response to said state-select signal.

10. The latch system of claim 1, wherein said temporary-set driver includes:
  an address logic that provides said state-select signal in response to an address signal; and
  a switch that responds to said mode select signal by decoupling said reset driver from said latch and coupling said address logic to said latch.

11. A precision digital-to-analog converter that converts a digital input signal into an analog signal at an output port, comprising:
  a binary-weighted current source that generates binary-weighted currents;
  current switches which each couple a respective one of said binary-weighted currents to said output port in response to a respective bit of said digital input signal;
  bidirectional-trim digital-to-analog converters that generate, in response to respective set and reset trim signals, respective bidirectional trim currents with respective amplitudes and directions; and
  an array of latch systems that provide both temporary and permanent set and reset trim signals;
  wherein each of said bidirectional-trim digital-to-analog converters is coupled to provide its bidirectional trim current to a respective one of said current switches for a linearizing adjustment of that switch's binary-weighted current;
  and wherein each of said latch systems includes:
    a) a latch that generates said set and reset trim signals in respective response to set and reset latch signals;
    b) a reset driver that applies said reset latch signal to said latch;
    c) a temporary-set driver which removes said reset latch signal from said latch in response to a mode-select signal and which applies said set latch signal to said latch in response to a state-select signal, said latch thereby generates said temporary set trim signal when said mode-select signal and said state-select signal are present and generates said temporary reset trim signal when said mode-select signal is present and said state-select signal is absent; and
    d) a permanent-set driver which includes a trimmable link and which, in response to the trimming of said link, removes said reset latch signal from said latch and applies said set latch signal to said latch, said latch thereby generates said permanent set trim signal when said mode-select signal is absent and said trimmable link is trimmed and generates said permanent reset trim signal when said mode-select signal is absent and said trimmable link is not trimmed.

12. A subranging analog-to-digital converter system that converts an analog input signal to a corresponding digital output signal, comprising:
  an initial analog-to-digital converter that converts said analog input signal to an initial set of digital bits of said digital output signal;
  a precision digital-to-analog converter that converts said respective set of digital bits to a converted analog signal at a converter output and subtracts said converted analog signal from said analog input signal to form an analog residue signal; and
  a final analog-to-digital converter that converts said analog residue signal to a final set of digital bits of said digital output signal;
  wherein said precision digital-to-analog converter includes:
    a) a binary-weighted current source that generates binary-weighted currents;
    b) current switches which each couple a respective one of said binary-weighted currents to said converter output in response to a respective bit of said initial set of digital bits;
    c) bidirectional-trim digital-to-analog converters that generate, in response to respective set and reset trim signals, respective bidirectional trim currents with respective amplitudes and directions; and
    d) an array of latch systems that provide both temporary and permanent set and reset trim signals;
  wherein each of said bidirectional-trim digital-to-analog converters is coupled to provide its bidirectional trim current to a respective one of said current switches for a linearizing adjustment of that switch's binary-weighted current;
  and wherein each of said latch systems includes:
    a) a latch that generates said set and reset trim signals in respective response to set and reset latch signals;
    b) a reset driver that applies said reset latch signal to said latch;
    c) a temporary-set driver which removes said reset latch signal from said latch in response to a mode-select signal and which applies said set latch signal to said latch in response to a state-select signal, said latch thereby generates said temporary set trim signal when said mode-select signal and said state-select signal are present and generates said temporary reset trim signal when said mode-select signal is present and said state-select signal is absent; and
    d) a permanent-set driver which includes a trimmable link and which, in response to the trimming of said link, removes said reset latch signal from said latch and applies said set latch signal to said latch, said latch thereby generates said permanent set trim signal when said mode-select signal is absent and said trimmable link is trimmed and generates said permanent reset trim signal when said mode-select signal is absent and said trimmable link is not trimmed.

* * * * *